United States Patent
Hsu et al.

(10) Patent No.: US 7,338,830 B2
(45) Date of Patent: Mar. 4, 2008

(54) HOLLOW DIELECTRIC FOR IMAGE SENSOR

(75) Inventors: Tzu-Hsuan Hsu, Kaohsiung (TW); Shou-Gwo Wuu, Hsin-Chu (TW); Ho-Ching Chien, Jhudong Township (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 286 days.

(21) Appl. No.: 11/271,116

(22) Filed: Nov. 10, 2005

(65) Prior Publication Data
US 2006/0063294 A1 Mar. 23, 2006

Related U.S. Application Data

(62) Division of application No. 10/799,986, filed on Mar. 12, 2004, now Pat. No. 6,982,443.

(51) Int. Cl.
*H01L 21/00* (2006.01)

(52) U.S. Cl. .................. 438/48; 257/232; 257/290
(58) Field of Classification Search ............... 438/48; 257/232–234, 290–292
See application file for complete search history.

(56) References Cited

OTHER PUBLICATIONS

TSMC, Ltd., "CMOS Image Sensing," Taiwan Semiconductor Manufacturing Company, Ltd., 2002-2004, Hsin-Chu, Taiwan, http://www.tsmc.com/english/technology/t0109.htm.

*Primary Examiner*—Thien F Tran
(74) *Attorney, Agent, or Firm*—Slater & Matsil, L.L.P.

(57) ABSTRACT

A plurality of apertures is formed in at least one first insulating layer disposed over a sensor formed in a semiconductor substrate. A second insulating layer is disposed over the at least one first insulating layer and the plurality of apertures in the at least one first insulating layer. The apertures form hollow regions in the at least one first insulating layer over the sensor, allowing more light or energy to pass through the at least one first insulating layer to the sensor, and increasing the sensitivity of the sensor.

19 Claims, 3 Drawing Sheets

HOLLOW DIELECTRIC FOR IMAGE SENSOR

This application is a divisional of patent application Ser. No. 10/799,986, entitled "Hollow Dielectric for Image Sensor," filed on Mar. 12, 2004 now U.S. Pat. No. 6,982,443, which application is incorporated herein by reference.

TECHNICAL FIELD

The present invention relates generally to the manufacturing of semiconductor devices, and more particularly to the fabrication of semiconductor devices with integrated image sensors.

BACKGROUND

Optical electronics are used many consumer electronics products, such as digital cameras, fax machines, scanners, security and surveillance cameras, personal computer (PC) cameras, camcorders, mobile phones, personal digital assistants (PDAs) and toys, as examples. Some optical electronics utilize image sensors that are fabricated on a semiconductor substrate, with logic circuitry and support circuitry being formed on the same substrate. For example, one such integrated image sensor device is a complementary metal oxide semiconductor (CMOS) image sensor. Integrated image sensor devices usually comprise an array of sensors formed proximate digital integrated circuit devices which may include logic circuits, transistors, and other active components.

A problem with image sensors formed on the same semiconductor substrate as logic and other circuitry is that several layers of dielectric material are deposited over the image sensor. The dielectric material layers decrease the sensitivity of the sensor, resulting in a decrease in the amount of light or energy sensed by the sensor, which degrades the sensitivity of the sensor.

Therefore, what is needed in the art is an improved CMOS image sensor design and method of fabrication thereof that results in increased sensitivity of the sensor.

SUMMARY OF THE INVENTION

These and other problems are generally solved or circumvented, and technical advantages are generally achieved, by preferred embodiments of the present invention, in which a dielectric having hollow regions is formed over a sensor of a semiconductor device, permitting more light or energy to reach the sensor, and resulting in a sensor with increased sensitivity. A plurality of apertures is formed in at least one first insulating layer disposed over the sensor, and a second insulating layer is deposited over the apertures and the at least one first insulating layer, encapsulating the apertures and creating hollow regions over the sensor beneath the second insulating layer and within the at least one first insulating layer.

In accordance with a preferred embodiment of the present invention, a semiconductor device includes a workpiece having a first region and a second region, and a sensor being formed in the first region. At least one first insulating layer is disposed over the sensor in the first region. The at least one first insulating layer is also disposed over the second region. A plurality of apertures is formed in each at least one insulating layer over the sensor. A second insulating layer is disposed over the at least one first insulating layer and the plurality of apertures in the at least one first insulating layer. Each aperture forms a hollow region beneath the second insulating layer within the at least one first insulating layer.

In accordance with another preferred embodiment of the present invention, a method of manufacturing a semiconductor device includes providing a workpiece, the workpiece including a first region and a second region. A sensor is formed in the first region, and at least one first insulating layer is formed over the sensor in the first region and over the second region. A plurality of apertures is formed in each at least one insulating layer over the sensor. A second insulating layer is formed over the at least one first insulating layer and the plurality of apertures in the at least one first insulating layer. Each aperture forms a hollow region beneath the second insulating layer within the at least one first insulating layer.

In accordance with yet another preferred embodiment of the present invention, a semiconductor device includes a workpiece having a first region and a second region, with a sensor being formed in the first region. At least one first insulating layer is disposed over the sensor in the first region and is disposed over the second region, the at least one first insulating layer having a thickness. Interconnects are disposed in the at least one first insulating layer in the second region of the workpiece. A plurality of apertures is formed in each at least one insulating layer over the sensor in the first region, each aperture extending through the thickness of the at least one first insulating layer. A second insulating layer is disposed over the at least one first insulating layer and the plurality of apertures in the at least one first insulating layer, the second insulating layer comprising a non-conformal dielectric material. Each aperture forms a hollow region beneath the second insulating layer within the at least one first insulating layer.

Advantages preferred embodiments of the present invention include providing a semiconductor device having a sensor with improved sensitivity. The apertures formed in the insulating layers over the sensor permit more energy or light to pass through the insulating layers and reach the sensor. The apertures decrease the amount of destructive interference that may be caused by the insulating layers when light or energy passes through the insulating layers. The pixel size of the sensor may be decreased in accordance with embodiments of the present invention.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a CMOS image sensor. Embodiments of the invention may also be applied, however, to other semiconductor devices having sensors formed in one region of a substrate and other circuitry such as support circuitry formed in another region. Only one sensor and/or support circuitry region is shown in each drawing; however, there may be many sensors and support circuitry regions formed on a single substrate.

Figure 1:
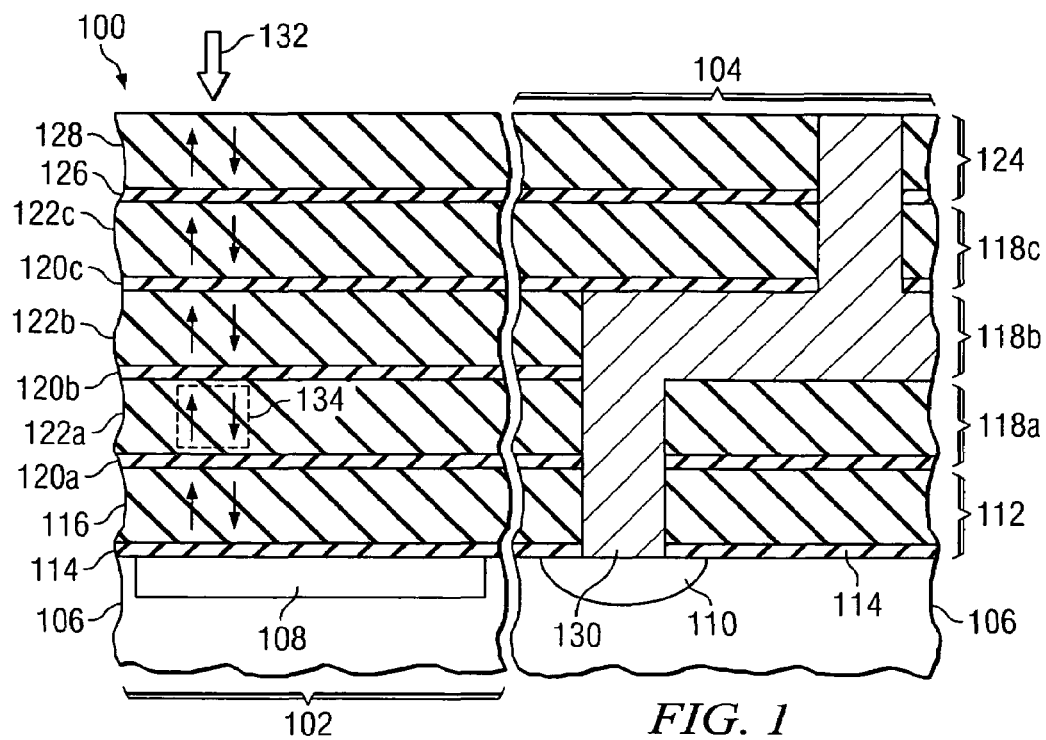
FIG. 1 shows a prior art semiconductor device including an integrated image sensor, wherein the insulating layers disposed over the sensor cause destructive interference and reduce the sensitivity of the sensor.

With reference now to FIG. 1, there is shown a prior art semiconductor device 100 including a workpiece 106 having a first region 102 and a second region 104. A sensor 108 is formed in the first region 102, and active areas 110 may be formed in the second region 104 of the workpiece 106. The active areas 110 may comprise transistors, diodes, capacitors, or other circuit elements formed in or over the workpiece 106. The active areas 110 may comprise support circuitry for the sensor 108, for example. Interconnects 130 are required to make electrical contact to the active areas 110. These interconnects 130 typically comprise conductive lines and vias comprised of metal or other conductors, and are usually formed in one or more insulating layers 112, 118a, 118b, 118c, and 124.

In many semiconductor device designs, multiple levels of interconnect are used to make electrical connection between the active areas 110 and other circuit components. For example, in FIG. 1, an inter-layer dielectric (ILD) layer 112 comprises a barrier layer 114 and an insulating layer 116 formed over the barrier layer 114. The barrier layer 114 may comprise silicon oxynitride (SiON), and the insulating layer 116 may comprise silicon dioxide or other insulating materials such as low k dielectric materials, as examples. Transistors and other components may also be formed over the workpiece 106, not shown. The ILD layer 112 covers the elements, such as transistors, components and active areas 110, and provides electrical isolation between and structural support for the elements.

One or more inter-metal dielectric (IMD) layers 118a, 118b, and 118c are typically formed over the ILD layer 112, as shown. Each IMD layer 118a, 118b, 118c usually includes a barrier layer 120a, 120b, 120c respectively, comprised of SiON, as an example, and an insulating layer 122a, 122b, 122c formed over the barrier layer 120a, 120b, and 120c, respectively. The interconnects 130 may comprise conductive lines or vias formed in each of the ILD layers 112 and IMD layers 118a, 118b, and 118c, for example.

The semiconductor device 100 may include a passivation layer 124 formed over the top IMD layer 118c, as shown. The passivation layer 124 may comprise a barrier layer 126 and a dielectric layer 128.

A problem with the semiconductor device 100 shown is that the insulating layers 112, 118a, 118b, 118c, and 124 are formed not only over the second region 104 comprising the active areas 110 and other circuit components, but the insulating layers 112, 118a, 118b, 118c, and 124 are also formed over the first region 102 comprising the sensor 108. This is disadvantageous because when light 132 or other form of energy is directed toward the sensor 108, destructive interference 134 occurs within each of the insulating layers 112, 118a, 118b, 118c, and 124. As the light 132 passes through each of the insulating layers 112, 118a, 118b, 118c, and 124, more and more destructive interference 134 occurs, resulting in a reduction in the amount of light 132 sensed by the sensor 108. This results in decreased sensitivity of the sensor 108. Sensitivity is defined as the output signal in brightness subtracted by the output signal in darkness. Therefore, larger pixel sizes are required for the sensor 108 to accommodate for this decrease in sensitivity, in prior art designs.

There is a demand in the image sensor industry for shrinking the pixel size of sensors and increase in the number of metallization layers, to decrease costs. These factors result in the reduction of the sensor area and degradation of the received light by a sensor, respectively. While readout circuits and various pixel structures may be used to mitigate these problems, other problems can be introduced. For example, the sensitivity of a sensor may be amplified by increasing the circuit gain, but the noise is also increased.

Embodiments of the present invention achieve technical advantages by providing a meshed dielectric structure with hollow regions formed by apertures in the insulating layers over a sensor to permit more energy or light to pass through the insulating layers and reach the sensor.

Figure 2:
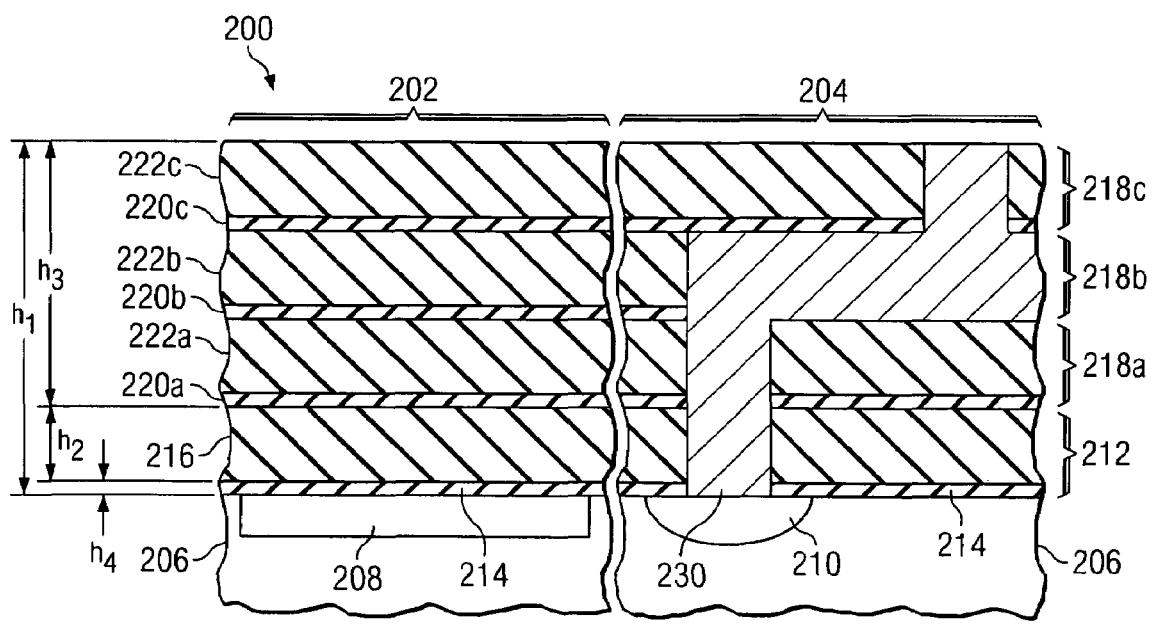
FIGS. 2 and 3 show cross-sectional views of a semiconductor device at various stages of manufacturing in accordance with a preferred embodiment of the present invention, wherein a plurality of apertures is formed in at least one first insulating layer disposed over the sensor.
Figure 3:
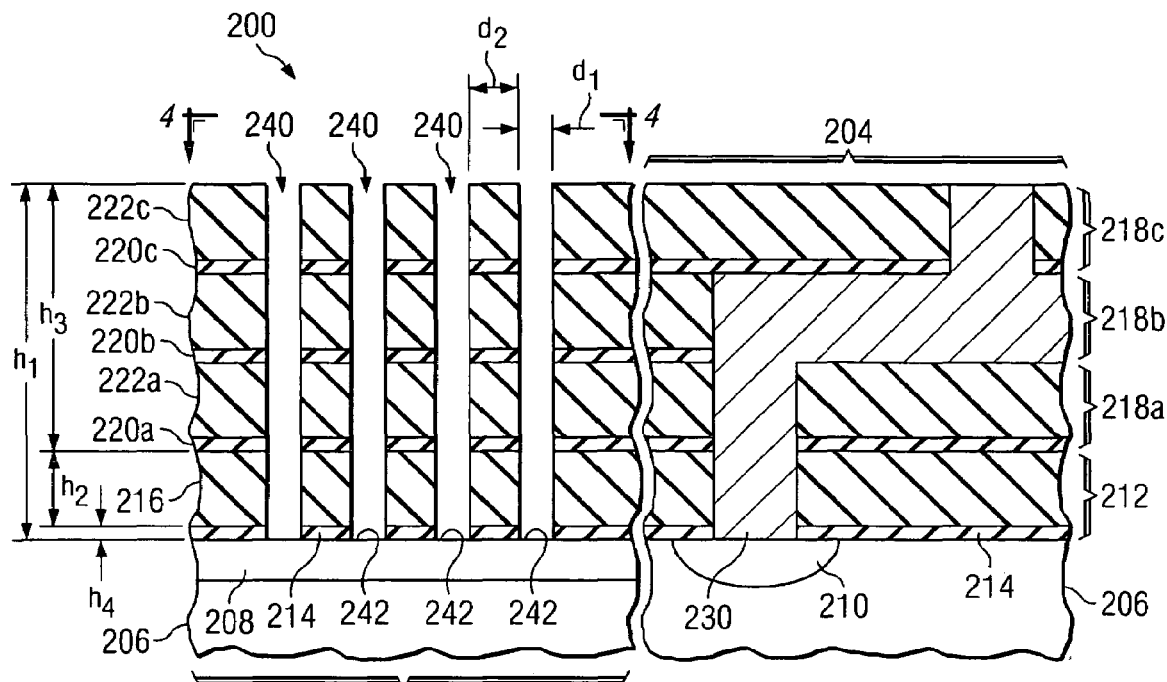
Figure 5:
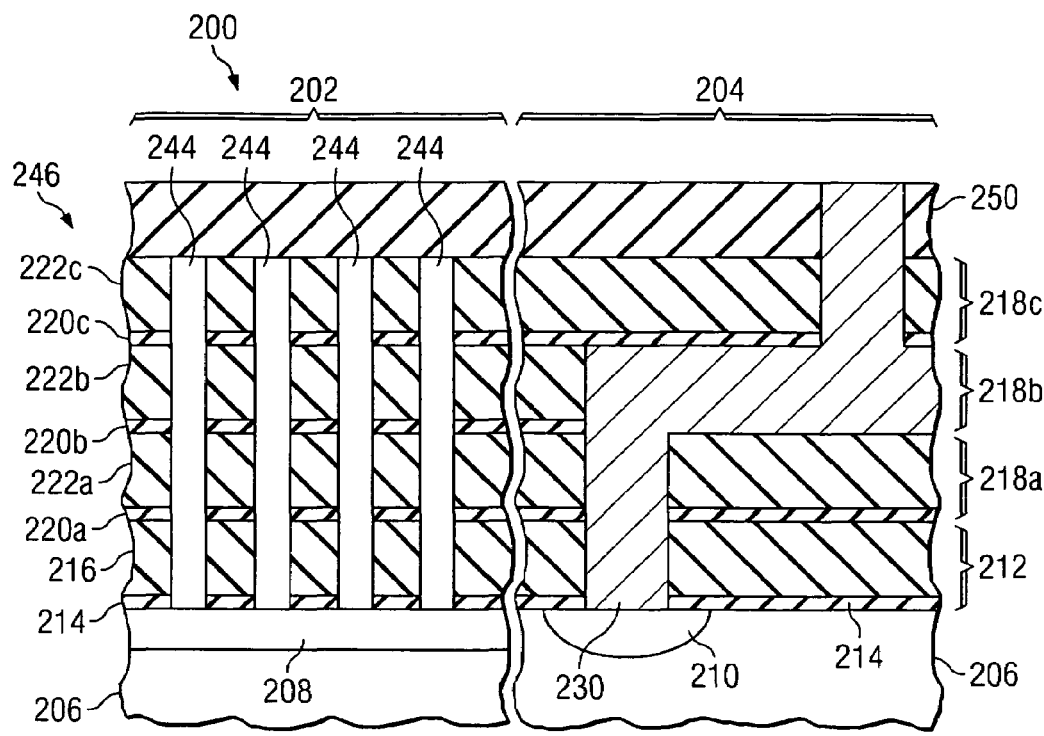
FIG. 5 shows a cross-sectional view of the embodiment of the present invention shown in FIGS. 2 through 4 after a second insulating layer is formed over the apertures and the at least one first insulating layer.

FIGS. 2, 3 and 5 show cross-sectional views of a semiconductor device 200 at various stages of manufacturing in accordance with a preferred embodiment of the present invention. First, a workpiece 206 is provided. The workpiece 206 may include a semiconductor substrate comprising silicon or other semiconductor materials covered by an insulating layer, for example. The workpiece 206 may also include other active components or circuits such as active regions 210. The workpiece 206 may comprise silicon oxide over single-crystal silicon, for example. The workpiece 206 may include other conductive layers or other semiconductor elements, e.g., transistors, diodes, etc. Compound semiconductors, GaAs, InP, Si/Ge, or SiC, as examples, may be used in place of silicon. The workpiece 206 may also comprise a silicon-on-insulator (SOI) substrate.

The workpiece 206 includes a first region 202 in which a sensor 208 comprising a photodiode, for example is formed, and a second region 204 in which active areas 210 and other active components are formed within and/or over the workpiece 206. There may be a plurality of first regions 202 and second regions 204 formed on a single semiconductor device 200, for example, although only one first region 202 and second region 204 is shown in FIG. 2.

In accordance with a preferred embodiment of the present invention, at least one first insulating layer 212, 218a, 218b, or 218c is formed over the workpiece 206 in both the first region 202 and the second region 204. The at least one first insulating layer 212, 218a, 218b, or 218c comprises a thickness $h_1$. The thickness $h_1$ of the at least one first insulating layer 212, 218a, 218b, or 218c may comprise about 9.0 μm or less, for example, although alternatively, the thickness $h_1$ may comprise other dimensions.

The at least one first insulating layer 212, 218a, 218b, and 218c may comprise an ILD layer 212 and a plurality of IMD layers 218a, 218b, and 218c, for example. Alternatively, the at least one first insulating layer 212, 218a, 218b, and 218c may comprise one or more IMD layers 218, e.g., the at least one first insulating layer may include 8 to 12 or more IMD layers 218 (not shown), as an example. The number of first insulating layers 212, 218a, 218b, or 218c formed depends on the number of layers required for the interconnect 230 formation. Alternatively, there may only be one insulating layer 212 (or 218) formed over the workpiece 206, for example (not shown).

In one embodiment, an ILD layer 212 comprising a barrier layer 214 and an insulating layer 216 is formed over the workpiece 206. The ILD layer insulating layer 216 may comprise silicon dioxide ($SiO_2$), fluorinated silicate glass (FSG) oxide, plasma-enhanced oxide, high density plasma (HDP) oxide, or spin-on glass (SOG), as examples, although alternatively, the ILD layer insulating layer 216 may comprise other insulating materials. The ILD layer insulating layer 216 may comprise a thickness $h_2$ of about 4,000 Å to about 10,000 Å, although alternatively, the ILD layer insulating layer 216 may comprise other dimensions, for example. The ILD layer barrier layer 214 may comprise silicon nitride (SiN) or silicon oxynitride (SiON), although alternatively, the ILD layer barrier layer 214 may comprise other insulating materials, as examples. The ILD barrier layer 214 may comprise a thickness $h_4$ of about 100 Å to about 800 Å, although alternatively, the ILD barrier layer 214 may comprise other dimensions, for example.

One or more IMD layers 218a, 218b, and 218c comprising a barrier layer 220a, 220b, and 220c, respectively, and an insulating layer 222a, 222b, and 222c, respectively, may be sequentially formed over the ILD layer 212 (e.g., IMD layer 218a is formed over ILD layer 212, IMD layer 218b is formed over IMD layer 218a, etc.). The IMD layers 218a, 218b, and 218c comprise a thickness $h_3$. Thickness $h_3$ which may comprise about 3.5 μm or less, for example, although alternatively, the thickness $h_3$ may comprise other dimensions.

Each IMD layer 218a, 218b, and 218c may comprise a barrier layer 220a, 220b, 220c, respectively, and an insulating layer 222a, 222b, 222c, disposed over each barrier layer 220a, 220b, 220c, respectively. The IMD layer barrier layers 220a, 220b, 220c may comprise silicon nitride (SiN) or silicon oxynitride (SiON), although alternatively, the IMD layer barrier layers 220a, 220b, 220c may comprise other insulating materials, as examples. Each IMD layer barrier layer 220a, 220b, 220c may comprise a thickness of about 100 Å to about 800 Å, as an example, although alternatively, the IMD layer barrier layers 220a, 220b, 220c may comprise other dimensions, for example. Each IMD layer insulating layer 222a, 222b, 222c may comprise $SiO_2$, fluorinated silicate glass (FSG) oxide, plasma-enhanced oxide, high density plasma (HDP) oxide, or spin-on glass (SOG), as examples, although alternatively, the IMD layer insulating layers 222a, 222b, 222c may comprise other insulating materials. Each IMD layer insulating layer 220a, 220b, and 220c may comprise a thickness of about 6,000 Å to about 11,000 Å, as an example, although alternatively, the IMD layers 220a, 220b, and 220c may comprise other dimensions.

The interconnects 230 may be formed by damascene processes, for example, by first depositing a barrier layer 220a and insulating layer 222a, patterning the IMD layer 218a with a desired pattern for the interconnects 230, filling the pattern in the IMD layer 218a with a conductive material, and then removing the excess conductive material from the top of the IMD layer 218a, for example. A dual damascene method may also be used to fill the patterns in two IMD layers 218a and 218b simultaneously, for example. ILD layer 212 and IMD layer 218c may also be patterned using damascene methods.

Alternatively, the interconnects 230 may be formed using a subtractive process. For example, a conductive material may be deposited over the workpiece 206, and the conductive material may be patterned in the desired interconnect 230 pattern. The barrier layer 214 and insulating layer 216 of the ILD layer 212 are then deposited over the interconnect 230. The IMD layers 218a, 218b, and 218c may also be formed using a subtractive process, by first depositing a conductive material, patterning the conductive material, and then depositing the IMD layers 218a, 218b, and 218c, respectively.

Next, in accordance with preferred embodiments of the present invention, a plurality of apertures 240 is formed in the at least one first insulating layer, which includes IMD layers 218c, 218b, 218a, and ILD layer 212, as shown in FIG. 3. The surface of the top IMD layer 218c may be exposed to a chemical-mechanical polish (CMP) process before the at least one first insulating layer 212, 218a, 218b, 218c is patterned.

Preferably, in one embodiment, the apertures 240 extend through a first thickness $h_1$ of the at least one first insulating layer 212, 218a, 218b, and 218c to expose a top surface 242 of the sensor 208, as shown. The apertures 240 may be formed using a single lithography process step, using a photoresist as a mask, for example, or alternatively, two or more lithography process steps may be required to pattern the first thickness $h_1$ of the at least one first insulating layer 212, 218a, 218b, and 218c. If the first thickness $h_1$ comprises about 2.5 μm or greater, for example, two or more etch process steps may be required to pattern the entire thickness $h_1$ of the at least one first insulating layer 212, 218a, 218b, and 218c, for example.

Figure 6:
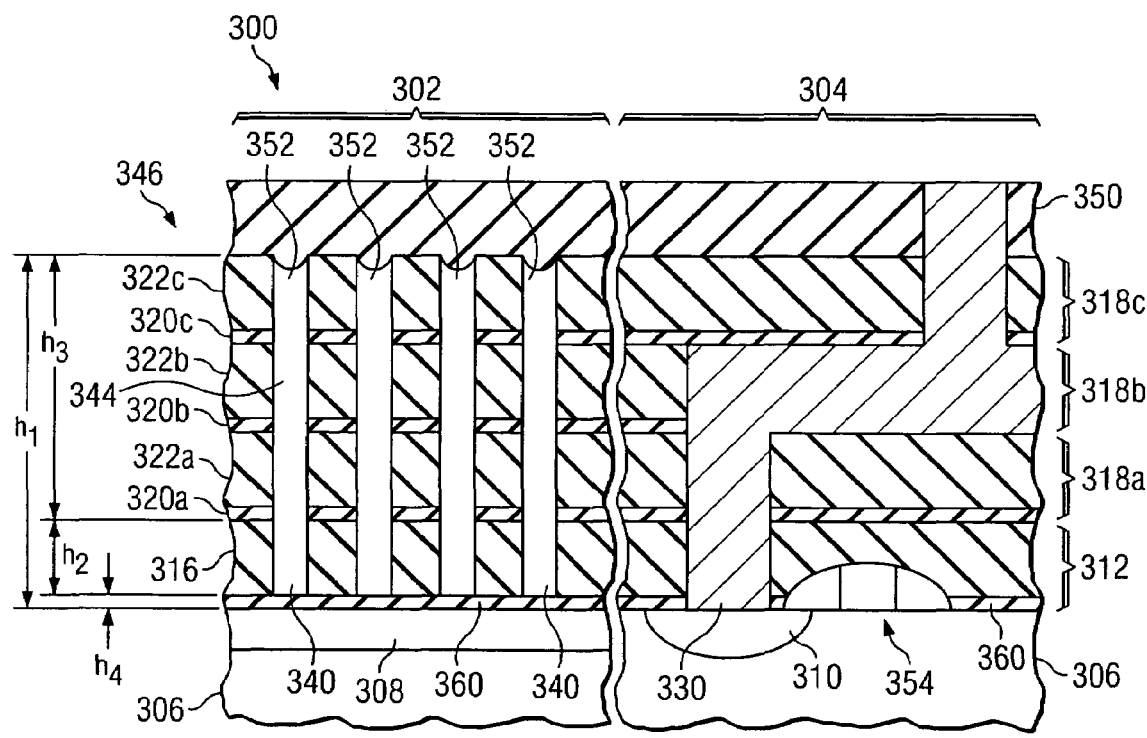
FIG. 6 shows another preferred embodiment of the present invention, wherein the second insulating layer formed over the apertures extends slightly into a top region of the apertures.

Preferably, in accordance with an embodiment of the present invention, the apertures 240 extend through a second thickness $h_2$ of the insulating layer 216 of the ILD layer 212 and also through a third thickness $h_3$ of the plurality of IMD layers 218a, 218b, and 218c. In one embodiment, the apertures 240 also extend through a fourth thickness $h_4$ of barrier layer 214 of the ILD layer 212. In another embodiment, the apertures 340 do not extend through the fourth thickness $h_4$ of barrier layer 314 of the ILD layer 312, as shown in FIG. 6.

Referring again to FIG. 3, the plurality of apertures 240 may comprise a width $d_1$ of about 1.0 μm or less, and in one embodiment, the plurality of apertures 240 comprise a width $d_1$ of about 0.1 μm to 0.2 μm, for example. The apertures 240 preferably comprise a width $d_1$ that is less than the width of a pixel of the sensor 208 (not shown), for example. The apertures 240 are preferably spaced apart from one another by at least about 0.1 μm, as shown as $d_2$.

Figure 4:
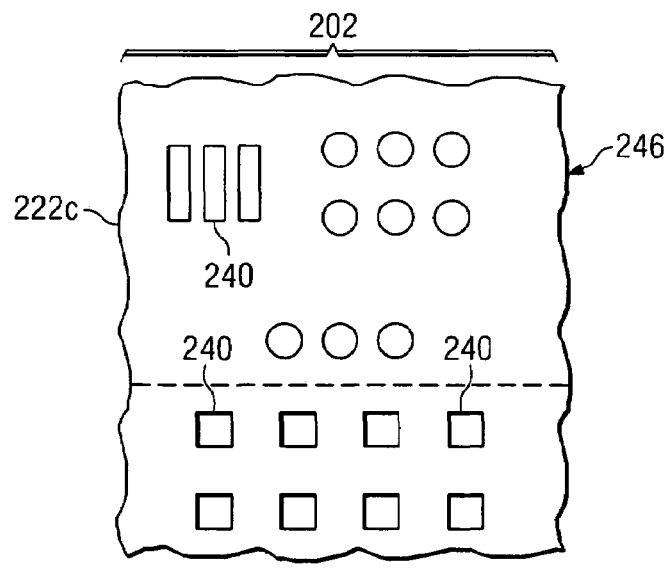
FIG. 4 shows a top view of the semiconductor device shown in FIG. 3.

FIG. 4 shows a top view of semiconductor device 200 shown in FIG. 3. The apertures 240 may comprise a shape of a circle, oval, square, rectangle, or combinations thereof, as shown in FIG. 4. All of the apertures 240 may comprise the same shape, although alternatively, the apertures 240 may comprise a variety of shapes, also shown in FIG. 4. The apertures 240 may alternatively other shapes, such as trapezoids, stars, or other shapes, as examples. The apertures 240 are formed in the first region 202 of the workpiece 206. Preferably, apertures 240 are not formed in the second region 204 of the workpiece 206.

Referring next to FIG. 5, a second insulating layer 250 is formed over the top IMD layer 118c, as shown. The second insulating layer 250 preferably comprises a non-conformal dielectric material that does not fill the apertures 240. Rather, the second insulating layer 250 forms a ceiling over and overlaying the apertures 240, forming hollow regions 244 within the at least one first insulating layer 212, 218a, 218b, and 218c. The hollow region 244 comprises voids or air gaps, for example. The second insulating layer 250 preferably comprises a transparent or translucent material. The second insulating layer 250 preferably comprises plasma enhanced (PE) oxide, although alternatively, the second insulating layer 250 may comprise other non-conformal insulating materials, such as silicon nitride (SiN) or silicon oxynitride (SiON), as examples. The second insulating layer 250 preferably comprises a thickness of about 4000 Å to about 8000 Å, although alternatively, the second insulating layer 250 may comprise other dimensions, for example.

The second insulating layer 250 overlays the apertures 240, sealing the apertures 240 and forming a meshed dielectric structure 246, as shown. The second insulating layer 250 may comprise a passivation layer, and may include a barrier layer of SiN or SiON and an insulating layer comprising PE oxide or other insulating material formed over the barrier layer, not shown.

FIG. 6 shows another embodiment of the present invention, wherein like numerals are used for the various elements described in FIGS. 2 through 5. To avoid repetition, each reference number shown in the diagram is not described again in detail herein. Rather, similar materials x02, x04, x06, x08, etc. . . . are preferably used for the material layers shown as were described for FIGS. 2 through 5, where x=2 in FIGS. 2 through 5 and x=3 in FIG. 6. As an example, the preferred and alternative materials and dimensions described for first insulating layer 216 in the description for FIGS. 2 through 5 are preferably also used for first insulating layer 316 in FIG. 6.

In the embodiment shown in FIG. 6, the second insulating layer 350 extends into a top region of each aperture 340 in the meshed dielectric structure 346, as shown at 352. The second insulating layer 350 may extend into the top region of each aperture 340 by about 100 Å or greater, for example. The amount that the second insulating layer extends into the top region of each aperture 340 depends on the width of the aperture 340.

Also, in this embodiment, the barrier layer 360 of the ILD layer 312 proximate the sensor 308 may not be patterned during the patterning of the apertures 340. In particular, the apertures 340 may not extend through the fourth thickness $h_4$ of the barrier layer 360 of the ILD layer 312, as shown. The barrier layer 360 may comprise a material that has a different etch selectivity than the overlying insulating layer 316. For example, the barrier layer 360 may comprise silicon nitride, and the insulating layer 316 may comprise silicon dioxide. Thus, etch chemistries such as $CF_4$, $C_3H_8$ or $CHF_3$, as examples, may be used to pattern the apertures 340, so that the barrier layer 360 is not patterned during the formation of the apertures 340. Alternatively, other etch chemistries may be used to pattern the apertures 340.

The barrier layer 360 preferably comprises a transparent or translucent material, allowing light or energy to be transmitted through the barrier layer 360. The barrier layer 360 may comprise a thickness $h_4$ of about 100 Å to about 800 Å, for example. The barrier layer 360 protects the top surface of the sensor 308 during the formation of the apertures 340 in this embodiment. Note that a device 354 such as a transistor is also shown formed over the workpiece 306 in FIG. 6 in the second region 304.

The barrier layers 214, 220a, 220b, 220c, 320a, 320b, 320c, 360 and the barrier layer of the second insulating layer 250/350 described herein may also function as anti-reflective layers, etch stop layers or buffer layers, for example.

The novel meshed dielectric structure 246/346 described herein disposed between the sensor 208/308 and the second insulating layer 250/350 provides several advantages. The hollow regions 244/344 formed by the apertures 240/340 in the insulating layers 212, 218a, 218b, and 218c/312, 318a, 318b, and 318c over the sensor 208/308 permit more light or energy to pass through the insulating layers 212, 218a, 218b, and 218c/312, 318a, 318b, and 318c, and thus provide increased sensitivity for the sensor 208/308. Pixels of the sensor 208/308 (not shown in the figures) may be made smaller due to the increased sensitivity. Alternatively, a pixel size may be maintained while improving the sensitivity of the sensor 208/308. Embodiments of the invention are particularly useful in deep submicron CMOS image sensor applications, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:

providing a workpiece, the workpiece including a first region and a second region;

forming a sensor in the first region;

forming at least one first insulating layer over the sensor in the first region and over the second region;

forming a plurality of apertures in each at least one first insulating layer over the sensor; and forming a second insulating layer over the at least one first insulating layer and the plurality of apertures in the at least one first insulating layer, wherein each aperture forms a hollow region beneath the second insulating layer within the at least one first insulating layer.

2. The method according to claim 1, further comprising forming interconnects in the at least one first insulating layer in the second region of the workpiece.

3. The method according to claim 1, wherein the at least one first insulating layer comprises a first thickness, wherein forming the plurality of apertures comprises extending the apertures through the first thickness of the at least one first insulating layer.

4. The method according to claim 3, wherein forming the at least one first insulating layer comprises forming a plurality of inter-metal dielectric (IMD) layers, the plurality of IMD layers comprising a second thickness, further comprising forming metal interconnects within the plurality of IMD layers, and wherein forming the plurality of apertures comprises extending the apertures through the second thickness of the IMD layers.

5. The method according to claim 4, wherein forming the at least one first insulating layer comprises forming an inter-layer dielectric (ILD) layer disposed over and abutting the workpiece, before forming the plurality of IMD layers, the at least one first insulating layer comprising a third thickness, and wherein forming the plurality of apertures comprises extending the apertures through the third thickness of the ILD layer and the second thickness of the plurality of IMD layers.

6. The method according to claim 5, wherein forming the ILD layer comprises forming about 4,000 Å to about 10,000 Å of SiO2, fluorinated silicate glass (FSG) oxide, plasma-enhanced oxide, high density plasma (HDP) oxide, or spin-on glass (SOG).

7. The method according to claim 5, further comprising forming a layer of silicon nitride or silicon oxynitride over the sensor, before forming the ILD layer, the silicon nitride or silicon oxynitride layer comprising a fourth thickness, wherein forming the plurality of apertures comprises extending the apertures through the fourth thickness of the silicon nitride or silicon oxynitride layer.

8. The method according to claim 5, further comprising forming a layer of silicon nitride or silicon oxynitride over the sensor, before forming the ILD layer, the silicon nitride or silicon oxynitride layer comprising a fourth thickness, wherein forming the plurality of apertures does not comprise extending the apertures through the fourth thickness of the silicon nitride or silicon oxynitride layer.

9. The method according to claim 4, wherein forming the plurality of IMD layers comprises forming a plurality of layers comprising SiN, SiON, SiO2, fluorinated silicate glass (FSG) oxide, plasma-enhanced oxide, high density plasma (HDP) oxide, spin-on glass (SOG), or combinations thereof.

10. The method according to claim 4, wherein forming each IMD layer comprises forming a barrier layer and forming an insulating layer over the barrier layer.

11. The method according to claim 10, wherein forming each IMD layer insulating layer comprises forming about 6,000 Å to about 11,000 Å of SiO2, fluorinated silicate glass (FSG) oxide, plasma-enhanced oxide, high density plasma (HDP) oxide, or spin-on glass (SOG), and wherein forming each IMD layer barrier layer comprises forming about 100 Å to about 800 Å of SiN or SiON.

12. The method according to claim 1, wherein forming each aperture comprises forming a shape of a circle, oval, square, rectangle, or a combination thereof.

13. The method according to claim 1, wherein forming each aperture comprises forming an aperture having a width of about 1.0 μm or less.

14. The method according to claim 1, wherein forming the plurality of apertures comprises forming the apertures spaced apart by at least about 0.1 μm.

15. The method according to claim 1, wherein forming the second insulating layer comprises forming a non-conformal dielectric material.

16. The method according to claim 1, wherein forming the second insulating layer comprises forming a transparent or a translucent material.

17. The method according to claim 1, wherein forming the second insulating layer comprises forming about 4000 Å to about 8000 Å of plasma enhanced (PE) oxide, silicon nitride (SiN) or silicon oxynitride (SiON).

18. The method according to claim 1, wherein each aperture comprises a top region, wherein forming the second insulating layer comprises forming the second insulating layer in the top region of each of the plurality of apertures.

19. The method according to claim 1, wherein forming the sensor comprises forming a photodiode.

* * * * *